United States Patent
Suaya et al.

(10) Patent No.: US 7,099,808 B2
(45) Date of Patent: *Aug. 29, 2006

(54) CAPACITANCE AND TRANSMISSION LINE MEASUREMENTS FOR AN INTEGRATED CIRCUIT

(75) Inventors: Roberto Suaya, Meylan (FR); Sophie H. M. Billy, Chatenay Malabry (FR)

(73) Assignee: Mentor Graphics Corp., Wilsonville, OR (US)

( * ) Notice: Subject to any disclaimer, the term of this patent is extended or adjusted under 35 U.S.C. 154(b) by 845 days.

This patent is subject to a terminal disclaimer.

(21) Appl. No.: 09/957,889

(22) Filed: Sep. 20, 2001

(65) Prior Publication Data

US 2002/0116696 A1 Aug. 22, 2002

Related U.S. Application Data

(63) Continuation-in-part of application No. 09/385,666, filed on Aug. 26, 1999, now Pat. No. 6,934,669.

(51) Int. Cl.
 *G06G 7/34* (2006.01)
 *G06G 7/60* (2006.01)
 *G06F 17/50* (2006.01)
 *G01V 3/02* (2006.01)
(52) U.S. Cl. ............... 703/4; 703/2; 703/4; 703/14; 716/4; 324/322
(58) Field of Classification Search .......... 703/4; 716/8
See application file for complete search history.

(56) References Cited

U.S. PATENT DOCUMENTS

| 5,212,454 | A | | 5/1993 | Proebsting | |
| 5,790,436 | A | * | 8/1998 | Chen et al. | 716/5 |
| 5,901,063 | A | | 5/1999 | Chang et al. | 716/4 |
| 5,999,010 | A | * | 12/1999 | Arora et al. | 324/765 |
| 6,011,731 | A | | 1/2000 | Beigel et al. | |
| 6,249,903 | B1 | | 6/2001 | McSherry et al. | |
| 6,300,765 | B1 | | 10/2001 | Chen | |
| 6,414,498 | B1 | | 7/2002 | Chen | |
| 6,934,669 | B1 | * | 8/2005 | Suaya et al. | 703/14 |

OTHER PUBLICATIONS

Chen et al., "Proper On-Chip Capacitance Measurement" (1999). p. 1-5. Mentor Graphics www.mentor.com/dsm.*

(Continued)

*Primary Examiner*—Paul L. Rodriguez
*Assistant Examiner*—Tom Stevens

(57) ABSTRACT

A method and apparatus for determining capacitance of wires in an integrated circuit is described. The capacitance information derived according to the invention can be used, for example, to calibrate a parasitic extraction engine or to calibrate an integrated circuit fabrication process. The capacitance information can also be used for timing and noise circuit simulations, particularly for deep sub-micron circuit design simulations. Briefly, a measurement of both total capacitance of a line and cross coupling capacitance between two lines is determined by applying predetermined voltage signals to specific circuit elements. The resulting current allows simple computation of total capacitance and cross coupling capacitance. Multiple cross coupling capacitance can be measured with a single device, thus improving the art of library generation, and the overall method is free of uncertainties related to transistor capacitance couplings. The capacitance values obtained can then be used to calibrate procedures, processes, devices, etc. Finally specific—parallel wire configurations—can be measured on homogeneous media and the resulting capacitance values can be used to extract high-frequency inductance parameters relevant to the description of wires and their environment in terms of transmission lines.

31 Claims, 10 Drawing Sheets

OTHER PUBLICATIONS

DeBroff et al., "Electromagnetic Concepts and Applications" (1996). p. 528-529,534-535. Prentice-Hall Inc. ISBN 0-13-301151-8.*

McGaughy et al., "*A Simple Method for On-Chip, Sub-Femto Farad Interconnect Capacitance Measurement*", IEEE Electron Device Letters, vol. 18. No. 1, Jan. 1997.

Chen et al., "An On-Chip, Attofarad Interconnect Charge-based Capacitance Measurement Technique", IEEE, 1996, pp. 3.4.1-3.4.4.

Sylvester et al., "Investigation of Interconnect Capacitance Characterization using Charge-based Capacitance Measurement Technique and 3-D Simulation", IEEE, 1997, pp. 491-494.

* cited by examiner

Figure I

CAPACITANCE AND TRANSMISSION LINE MEASUREMENTS FOR AN INTEGRATED CIRCUIT

RELATED APPLICATION DATA

This application is a continuation-in-part of U.S. patent application Ser. No. 09/385,666, filed Aug. 26, 1999, now U.S. Pat. No. 6,934,669 which is hereby incorporated by reference.

FIELD OF THE INVENTION

The invention relates generally to the measurement of circuit parameters. More particularly, the invention relates to a method and apparatus for a high-precision measurement of cross-coupling of wires in an integrated circuit design, and its application to the determination of high-frequency parameters that characterize the behavior of transmission lines.

BACKGROUND

Timing behavior of integrated circuits traditionally have been dictated by transistor considerations, mostly transistor travel time and the number of logic levels a signal traverses during a clock cycle. Accurate models of transistor device parameters were the key element for the prediction of circuit timing behavior. Wire delay, conversely, was at most 20% of the total delay in the circuit. Consequently, high-precision measurements of wire delay were superfluous.

More recently, with the advent of deep submicron integrated circuits, wire delays have become a major contributor to the total signal delay. For example, up to 75% of the total delay (in the absence of repeaters) can be accounted by wire delay. The are several reasons for this increased importance in wire delays: (1) transistor contribution to wire delay decreases with scaling (i.e., the semi-uniform decrease of transistor, and wire dimensions) and, (2) the capacitance of wires varies slowly with scaling.

The combination of (1) and (2) makes the relative contribution of wire capacitance to the total delay increasingly important with technology scaling. This new technological regime (that emerged when minimal dimensions reached 0.25 microns) increases the need for accuracy in the determination of capacitance. The proper determination of wire delay also requires the knowledge of total capacitance and cross-coupling capacitance to nearest neighbors. The presence of cross-coupling capacitance can impact the delay estimation by nearly 400% in the presence of switching activity by nearby wires.

Another physical effect that impacts the proper behavior of integrated circuits is that due to noise on quite lines. The controllability of the noise on nearby quite lines demands the accurate knowledge of different cross-coupling capacitance terms. It is therefore desirable to come up with a methodology that can determine with high precision and accuracy each one of the cross-coupling capacitance terms that contribute to the total capacitance of a wire.

One approach to accurate wire capacitance measurement is provided by B. W. McGaughy, J. C. Chen, D. Sylvester and C. Hu "A Simple Method for On-Chip Sub-Femto Farad Interconnect Capacitance Measurement," *IEEE Electron. Device Letters*, Vol. 18, No. 1, pp. 21–23, January 1997, (hereinafter referred to as "the IEEE paper").

FIG. 1 represents the circuit 10 used in the IEEE paper to measure cross-coupling capacitance between the two wires 30, 32 on the right hand side of the figure. The circuit 10 has a mirror structure formed by two inverter-like configurations 14, 16 for implementing a comparative method of measuring capacitance. The configuration 14 includes a PMOS transistor 18 connected in series to an NMOS transistor 20 with the wire 12 connected therebetween. Gates of the transistors 18, 20 are coupled to input signals V1, V2 for controlling the charging and discharging of the wire 12. An ammeter 22 is also coupled in series with transistors 18, 20 to measure the current needed to charge the wire 12. The second inverter-like configuration 16 is intended to be an exact replication of the first configuration 14. For example, the second configuration 16 includes a PMOS transistor 24 coupled in series with an NMOS transistor 26 and an ammeter 28. A second wire 30 is coupled between the transistors 24, 26 and is charged and discharged by input signals V1 and V2, similar to wire 12. A third wire 32 is placed near wire 30 so that a capacitive coupling occurs between wires 30, 32, wire 32 being grounded.

FIG. 2 shows voltage waveforms used in the circuit of FIG. 1. The voltage waveforms are non-overlapping to ensure no current path exists (except for leakage) between $V_{dd}$ and ground. Using these waveforms, the charge, Q, on the wire 12 can be measured using the formula $Q=(C_{substrate}+C_{other}) V_{dd}$, where $C_{substrate}$ is the capacitance between the wire 12 and the substrate of the integrated circuit and $C_{other}$ includes other capacitances associated with the configuration 14, including the capacitance of the transistor 18.

Similarly, the charge on wire 30 can be calculated as $Q'=(C_{substrate}+C_{other}+C_{cross-coupling}) V_{dd}$, where $C_{substrate}$ is the capacitance between the wire 30 and the substrate of the integrated circuit and $C_{other}$ includes other capacitance associated with the configuration 16, including the capacitance associated with the transistor 24. $C_{cross-coupling}$ is the cross-coupling capacitance between the wires 30, 32.

By subtracting Q from Q', theoretically, only the $C_{cross-coupling}$ remains. However, this determination of the cross-coupling capacitance assumes that the electric field configuration between wire 14 and substrate on the left side of FIG. 1 is identical to the electric field configuration between wire 30 and substrate on the right side. In reality, these two configurations are not identical. In particular, the wire 32 affects the field distribution causing a charge redistribution error in $C_{substrate}$ of wire 30. This change in $C_{substrate}$ can be significant causing errors in the measurement of the cross-coupling capacitance. Additionally, the transistors 18, 20 are not identical to transistors 24, 26, which introduces additional errors.

FIG. 3 shows a configuration where the measurement of the cross-coupling capacitance using the method described in the IEEE paper can result in a 70% error. In this example, the wires 36, 38 are on the same metal layer as wire 40 and separated by minimum distance and, under these condition, the charge redistribution effect to the substrate is much larger.

The error of the IEEE method, on the other hand, can be made quite small for total capacitance measurements only, with a simple change to the structure in FIG. 1, consisting of eliminating wire 12 on the left hand side of FIG. 1. Transistor inequality errors persist in total capacitance measurements.

Therefore, there is a need for a more effective technique to measure the cross-coupling capacitance in integrated circuits.

SUMMARY

The present invention provides a test structure that determines cross-coupling capacitance without requiring a mirror configuration. Instead, only a single inverter-like circuit may be used, thereby eliminating transistor mismatch problems and charge redistribution errors.

In one aspect, a first wire is placed in the presence of a second wire so that cross-coupling occurs between the two wires. Two separate measurements are performed. One of the measurements is performed while charging the first wire with the second wire grounded to create a cross-coupling capacitance between the two wires. A second measurement is performed while charging the first wire with the second wire charged to the same potential as the first wire. With the second measurement, because the two wires are charged to the same potential, the cross-coupling capacitance contribution to the charge measurement is eliminated. The cross-coupling capacitance can then be computed by using the difference between the two measurements.

In another aspect, two transistors are coupled in series between $V_{dd}$ and ground. The two transistors are connected at a common node, to which the first wire also is connected. Gates of the two transistors are coupled to separate voltage signals that control the charging and discharging of the first wire to perform the first and second measurements. The signals are timed to ensure that there is no short circuit between $V_{dd}$ and ground (except, perhaps, for leakage currents).

In another aspect, a simple configuration is used to provide the proper signaling scheme to switch from fully coupled wires to decoupled wires.

In yet another aspect, cross-coupling capacitance for multiple neighbor wires to the first wire may also be measured. The multiple neighbor wires may be on any layers and in any orientation relative to the first wire. To measure the cross-coupling capacitance of the multiple neighbor wires, the same technique and same transistor configuration is used that was used to measure cross-coupling capacitance between the first and second wires. Each one of the multiple wires whose coupling one wishes to determine is fed by its own inverter. However, any neighbor wire that is not being measured is grounded.

In still another aspect, the measurement of multiple cross-coupling capacitances may be achieved using one library element. Prior art techniques typically require multiple library elements to implement the test environment, which can cause additional inaccuracies.

In another aspect, the high frequency inductance matrix can be calculated using the low frequency measurements of cross-coupling capacitance and total capacitance for configurations involving nearby parallel wires.

The foregoing and other aspects of the invention will become more apparent from the following detailed description of exemplary embodiments that proceeds with reference to the following drawings.

DETAILED DESCRIPTION

The invention provides a method and apparatus for determining cross-coupling capacitance of wires in an integrated circuit. The capacitance information derived may be used, for example, to calibrate a parasitic extraction engine or to calibrate an integrated circuit fabrication process. The capacitance information may also be used to improve timing and noise simulations of circuits, particularly for deep sub-micron circuits where wire capacitance effects play a dominant role. The capacitance information can also be used to determine the high frequency (microwave frequencies) parameters needed to describe the behavior of transmission lines.

Figure 1:
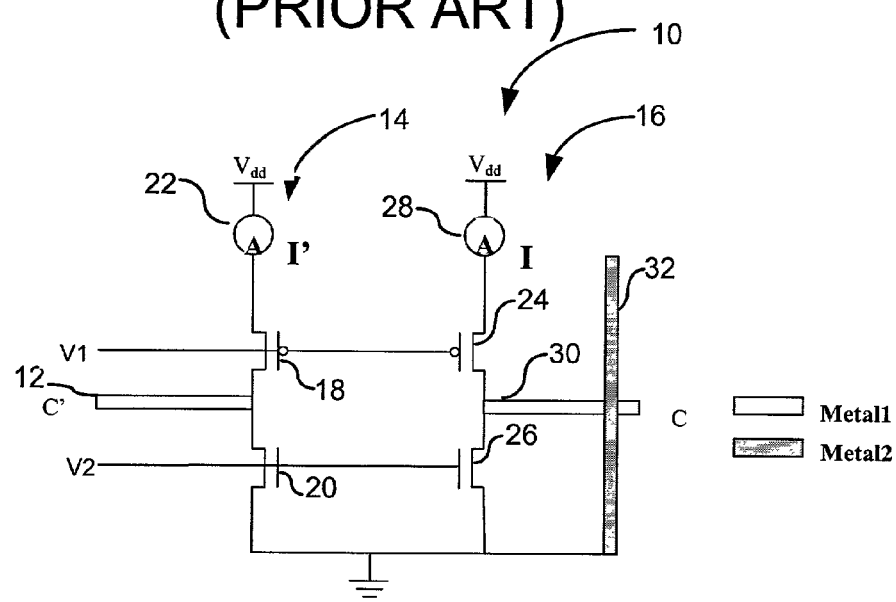
FIG. 1 is a prior art circuit for use in measuring cross-coupling capacitance
Figure 2:
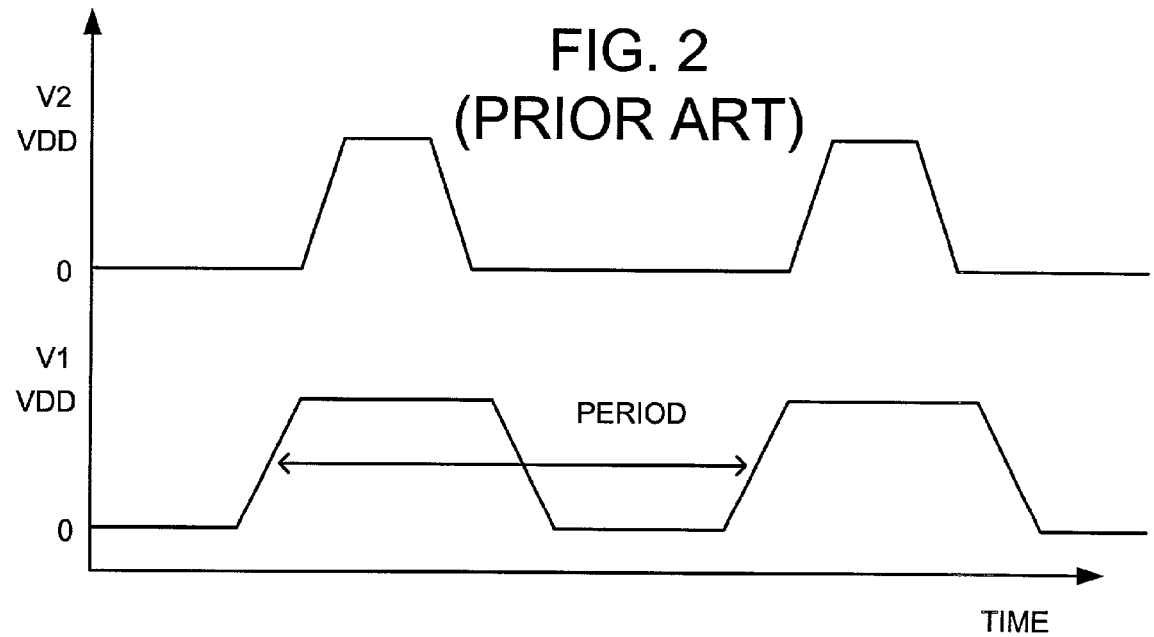
FIG. 2 is a voltage waveform used to measure the capacitance of the circuit of FIG. 1.
Figure 3:
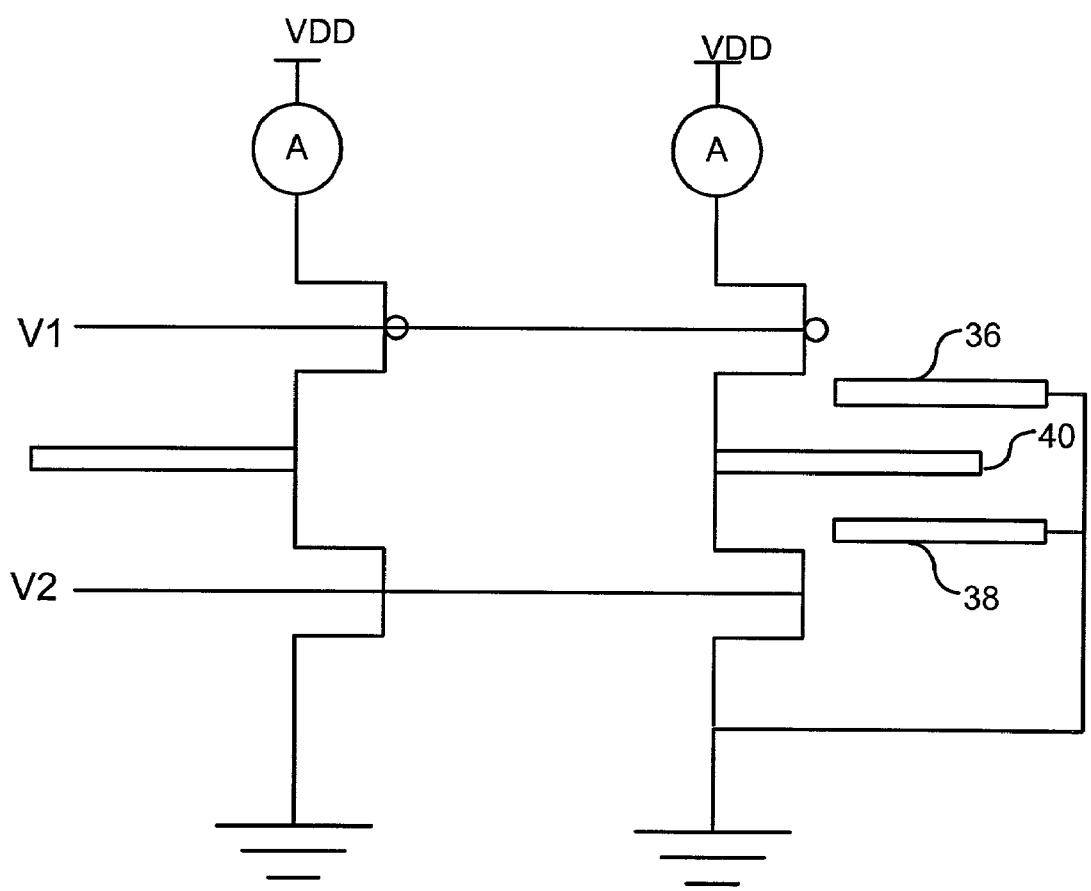
FIG. 3 is a prior art circuit for measuring cross-coupling capacitance between parallel wires on the same metal layer of an integrated circuit
Figure 4:
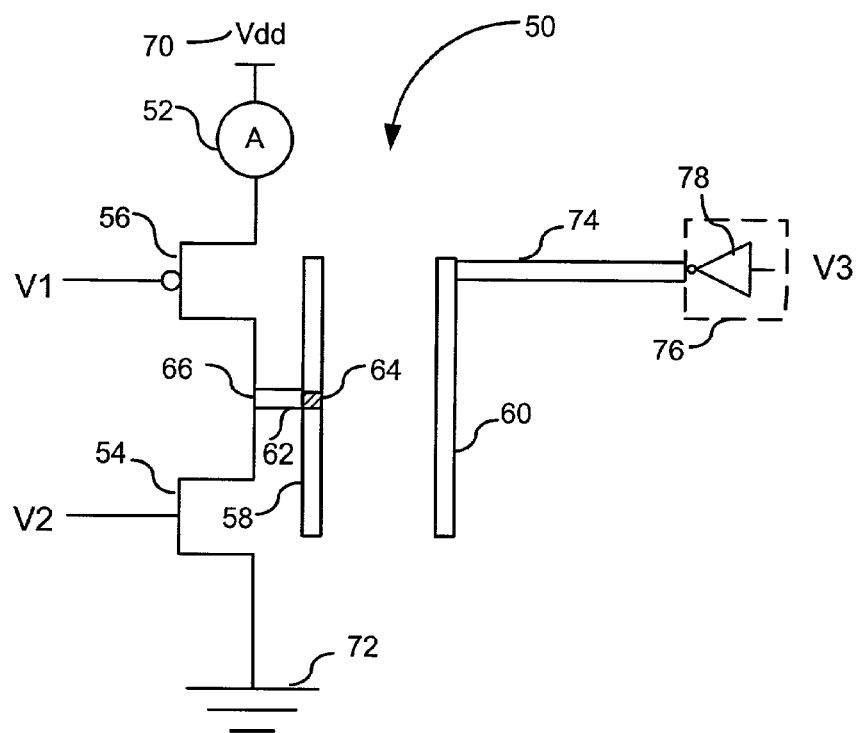
FIG. 4 is a circuit for determining cross-coupling capacitance according to one embodiment of the invention.

FIG. 4 shows a circuit 50 suitable for use in determining cross-coupling capacitance without the transistor mismatch or charge redistribution errors discussed in relation to the prior art of FIG. 1. The circuit 50 can be used in an integrated circuit (not shown) having multiple layers. An ammeter 52 is coupled in series with an N-type transistor 54 and a P-type transistor 56. A load wire 58 is positioned near a neighbor wire 60 whose cross-coupling capacitance is to be measured. The neighbor wire 60 may be at any orientation relative to load wire 58 (e.g., parallel or non-parallel). Additionally, the wires 58, 60 may be on different metal layers in the integrated circuit or the same layer. The load wire 58 is attached to node 66 via minimum size connection here represented by via 64 and wire 62. Voltage signals V2, V1, are coupled to gates of the transistors 54, 56 and control the charging and discharging of the load wire 58. The voltage signals V2, V1 are timed to ensure no short circuit (except leakage) is created between $V_{dd}$ 70 and ground 72. Neighbor wire 60 is connected to a wire 74, which is positioned to make negligible cross-coupling therebetween. The wire 74 is connected to control logic 76 for charging and discharging wire 60. In the illustrated example, the control logic 76 includes an inverter 78 controlled through voltage signal V3. Those skilled in the art will recognize that a wide variety of logic gates or other electrical components can be used in place of the inverter 78 (e.g. external signal, a buffer, a more complex gate to drive multiple wires).

The circuit 50 is used to measure the cross-coupling capacitance between the wires 58 and 60. As further described below, these measurements are accomplished through a series of steps including charging and discharging the wires 58, 60 and by measuring the current that passes through the ammeter 52. Once the current in the ammeter and the period T of the signals is used to determine the charge, Q, the capacitance C can be determined using the following formula:

$$Q = IT = CV_{dd}$$

$$I = \frac{1}{T}\int_0^T i(t)dt$$

Where I is the DC current reading and i the instantaneous current.

Figure 6:
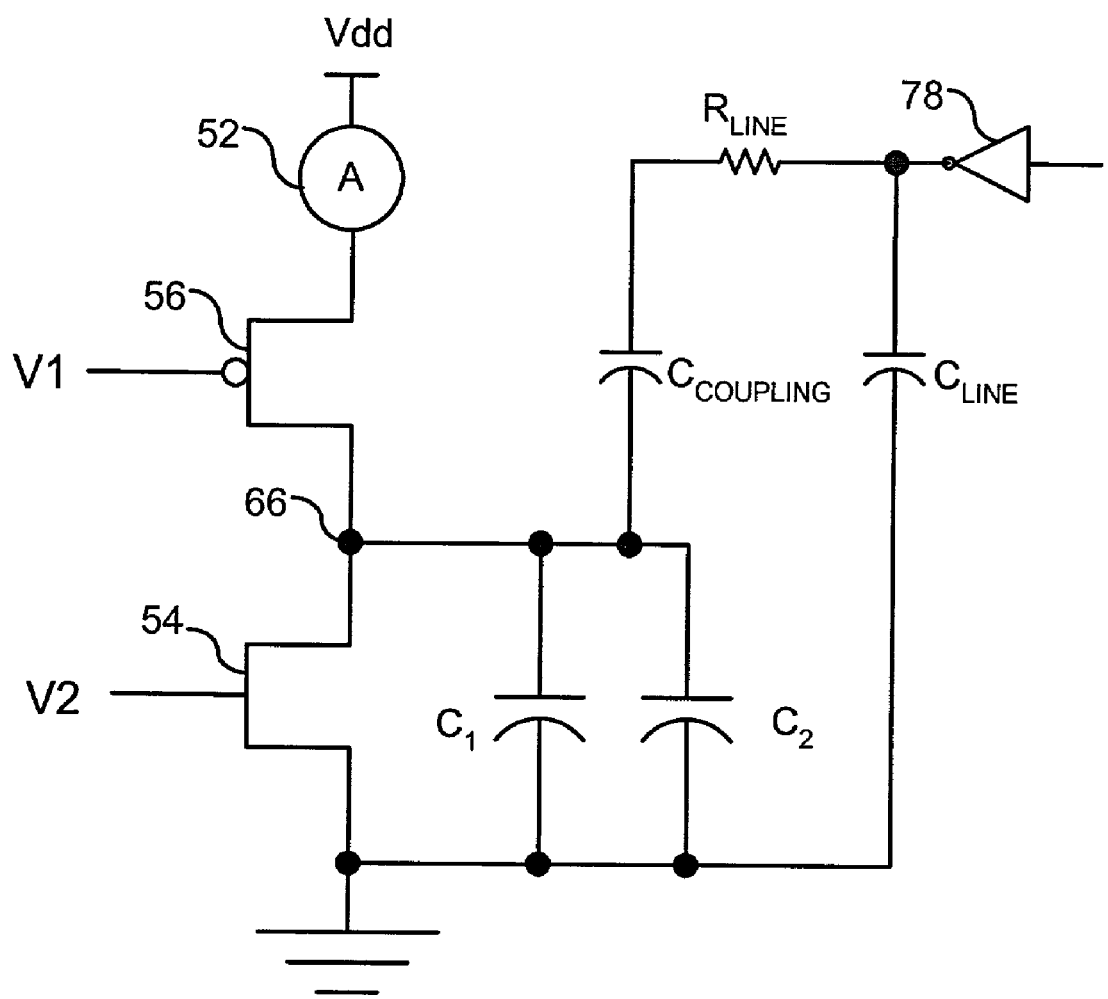
FIG. 6 is an equivalent circuit diagram corresponding to the circuit of FIG. 4.

FIG. 6 is an equivalent circuit diagram corresponding to the circuit of FIG. 4. For purposes of discussion, the wires 58 and 60 (FIG. 4) are assumed to be on metal layer 2 (Metal2) and the wire 62 is assumed to be on metal layer 2 (Metal2). With reference to the circuit of FIG. 6, the following name convention applies: $C_1$ refers to the capacitance of the transistor 56 plus Metal1-via-Metal2 minimum structure and other parasitic capacitances to ground; $C_2$ refers to the Metal2 ground capacitance; $C_{line}$ is the total capacitance of the neighbor wire 74 (see FIG. 4); and $C_{coupling}$ is the capacitance coupling between wires 58 and 60. $R_{line}$ refers to the resistance in the wire 74. These capacitance values are used in relation to FIG. 7 to measure the cross-coupling capacitance.

Figure 7:
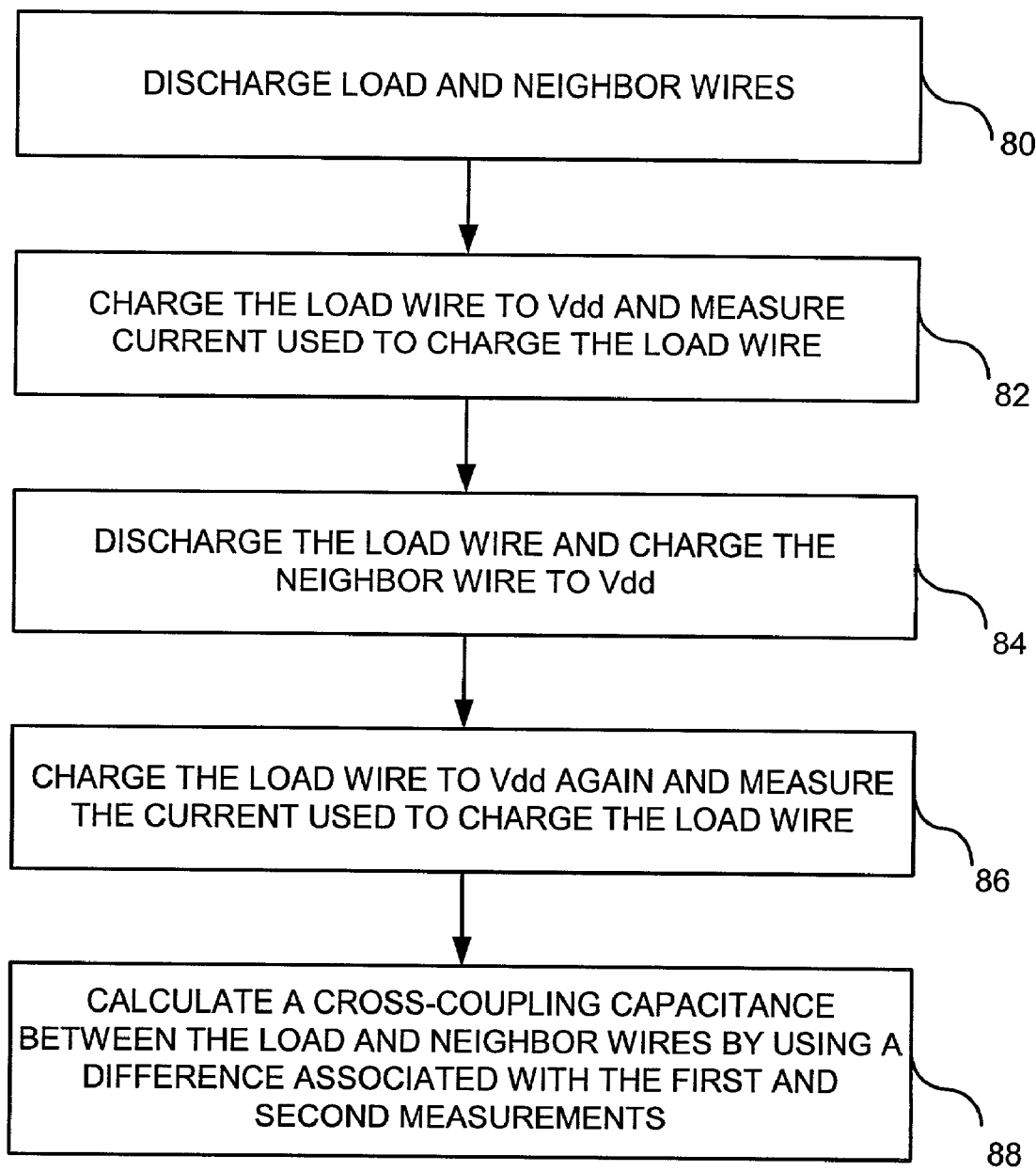
FIG. 7 is a flowchart of a method for measuring cross-coupling capacitance between two wires.

FIG. 7 is a flowchart of a method for determining cross-coupling capacitance between wires 58 and 60 in FIG. 4. In process block 80, the load wire 58 and wire 60 are discharged. The discharging of wire 58 is accomplished by asserting V2 to $V_{dd}$, which turns ON transistor 54 to ground the wire 58. The grounding of wire 60 is accomplished by applying a logic high voltage level to V3 causing the inverter 78 to ground wire 60. In process block 82, the wire 58 is charged and a first measurement is taken using ammeter 52 to determine an amount of charge needed to charge the wire 58 to $V_{dd}$. In order to charge wire 58, the transistor 54 is turned OFF and subsequently transistor 56 is turned ON, by grounding V1 (caution is taken to ensure both transistors are not ON simultaneously). During this first measurement, a cross-coupling capacitance coupling exists between the wires 58,60 because there is a difference in voltage levels on these two wires. The first measurement can be used with the following formula:

$$Q = (C_1 + C_2 + C_{coupling})V_{dd} \quad \text{(Equation 1)}$$

where $C_1$ and $C_2$ were described in relation to FIG. 6.

In process block 84, the wire 58 is discharged by turning ON transistor 54. Additionally, the second wire 60 is charged to $V_{dd}$ by setting V3 to a low voltage level. In process block 86, the load wire 58 is recharged using the proper voltage signals on V2 and V1 as already described. The amount of charge required to charge wire 58 is determined using the ammeter 52.

This second measurement can be used with the following formula:

$$Q' = (C_1 + C_2)V_{dd} \quad \text{(Equation 2)}$$

In process block 88, the cross-coupling capacitance is calculated by taking a difference between Q and Q' in Equation 1 and Equation 2. The terms $C_1 + C_2$ are identical in both Equation 1 and Equation 2 and cancel out leaving $C_{coupling}$ according to the following formula:

$$C_{coupling} = (Q - Q')/V_{dd}$$

Figure 5:
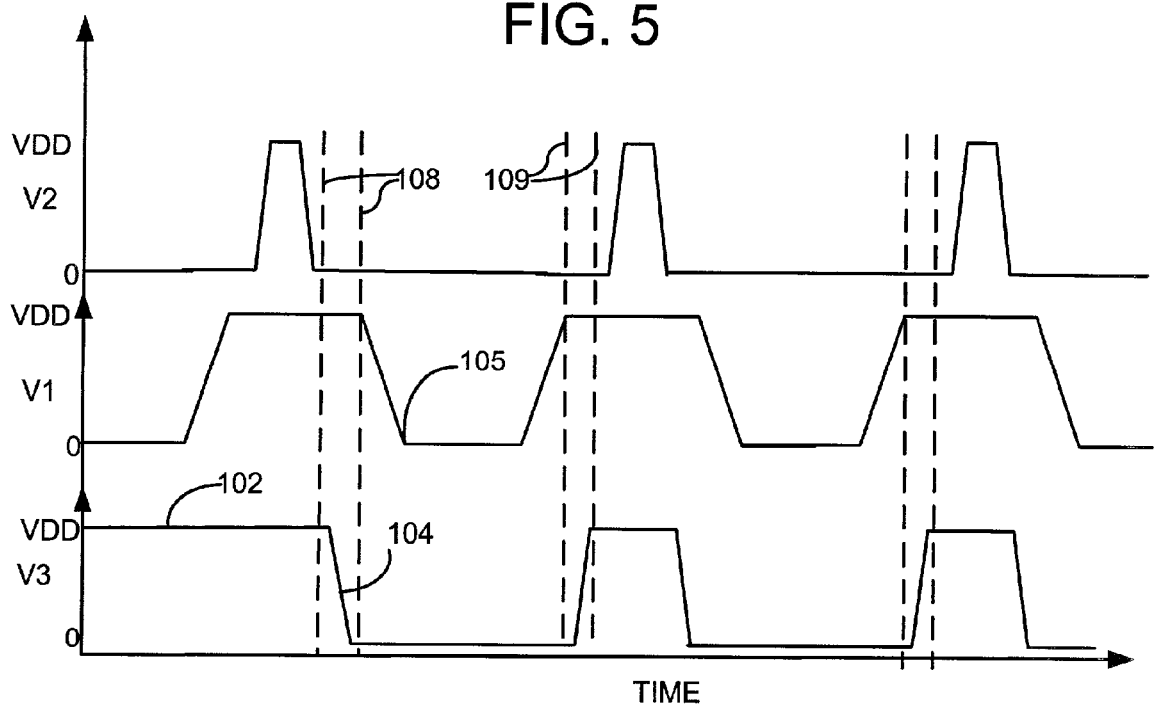
FIG. 5 is a voltage waveform used to control the timing of the circuit of FIG. 4.

FIG. 5 is a voltage waveform used in measuring the cross-coupling capacitance of the circuit of FIG. 4. Voltage V2 is applied to the gate of transistor 54, voltage V1 is applied to the gate of transistor 56, and voltage V3 is input to the control logic 76. The waveforms in FIG. 5 have the same period T, and only need to satisfy the sequencing requirements of FIG. 5, permitting low frequency measurements (in the few MHz range). During a first interval of time 102, the signal V3 set to $V_{dd}$ to discharge the neighbor wire 60. Periodic signals V2 and V1 are then applied to the N- and P-type transistors. Ammeter 52 is used to measure the charge, Q, that flows into node 66 (and wire 58). Node 66 is charged when $V_2 = V_1 = $ Ground, and this charge is equal to:

$$Q = IT = (C_1 + C_2 + C_{coupling})V_{dd}$$

The relative rise and fall times of the external signals do not matter. After the first interval of time 102, the first current reading is completed. After a sufficient number of cycles over which the previous measurement was averaged, the voltage signal V3 is applied as a periodic signal having the same period as that of V2 and V1 (see FIG. 5). Once V3 is switched, as shown at 104, the neighbor wire 60 is set to $V_{dd}$ and $C_{coupling}$ is charged to $V_{dd}$. This charge redistributes among the capacitors because node 66 is in a high impedance state. The intermediate voltage at node 66 is not important, provided that the switching of transistors 52, 54 is not altered. The intermediate voltage level is given by:

$$V_{int} = (C_{coupling}/(C_{coupling} + C1 + C2))*Vdd$$

It is preferable that this value does not drop below the threshold voltage of transistor 54.

Next, V1 is switched to ground (see 105) and current flows into ammeter 52 such that:

$$Q' = (C_1 + C_2)Vdd$$

flows into node 66. The difference between the direct current readings (when $V_3 = V_{dd}$, on static mode, and when $V_3$ 0 on oscillating mode) identifies $C_{coupling}$.

$$C_{coupling} = (Q - Q')/V_{dd}$$

The dashed lines 108 (FIG. 5) show that a delay exists after V2 switches transistor 54 OFF but before V1 switches transistor 56 ON. Similarly, dashed lines 109 show that a delay exists between V1 switching transistor 56 OFF and V2 switching transistor 54 ON. These delay intervals may be set to any desired value, but should be a sufficient time to ensure the transistors 54, 56 are not ON simultaneously.

Leakage currents, if present, can be taken into account and subtracted from Q and Q' by repeating the previous two measurements with $V1 = V_{dd}$, and the other parameters as before. More particularly, the voltages V1 and V3 can be left at $V_{dd}$, with V2 oscillating. The leakage current can then be measured and subtracted from Q. Then with $V1 = V_{dd}$, both V2 and V3 are oscillated and the leakage current can be measured again and subtracted from Q'. Thus, the correct charges are the resulting effect of subtracting the leakage charges from the measured charges. The leakage correction should be small compared to the measured currents, for the procedure to be accurate. This can be controlled by appropriate setting of the threshold voltage (during manufacturing) and/or by increasing the frequency of operation (during measuring).

Figure 8:
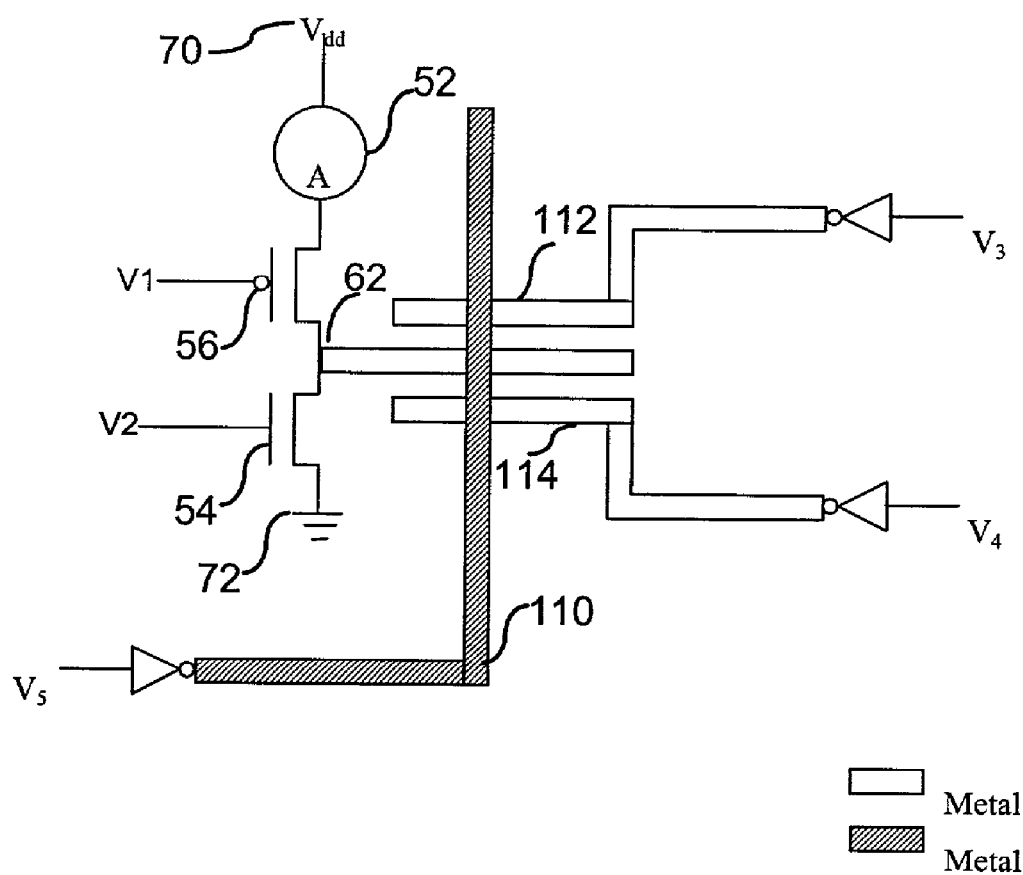
FIG. 8 is a circuit for measuring the cross-coupling capacitance between multiple neighbor wires.

FIG. 8 shows that the same structure of FIG. 4 may be used to measure the cross-coupling capacitance of multiple neighbor wires that can be on different metal layers and that have any orientation relative to the load wire 58. In the example of FIG. 8, the neighbor wires include same layer neighbor wire 112 and 114. Wire 110 is in a different layer. (Additionally, wires 112, 114 need not be parallel relative to load wire 58 and could be on different metal layers). Although only three neighbor wires are shown, the invention can easily be extended to measure the cross-coupling capacitance of any desired number of neighbor wires.

Figure 9:
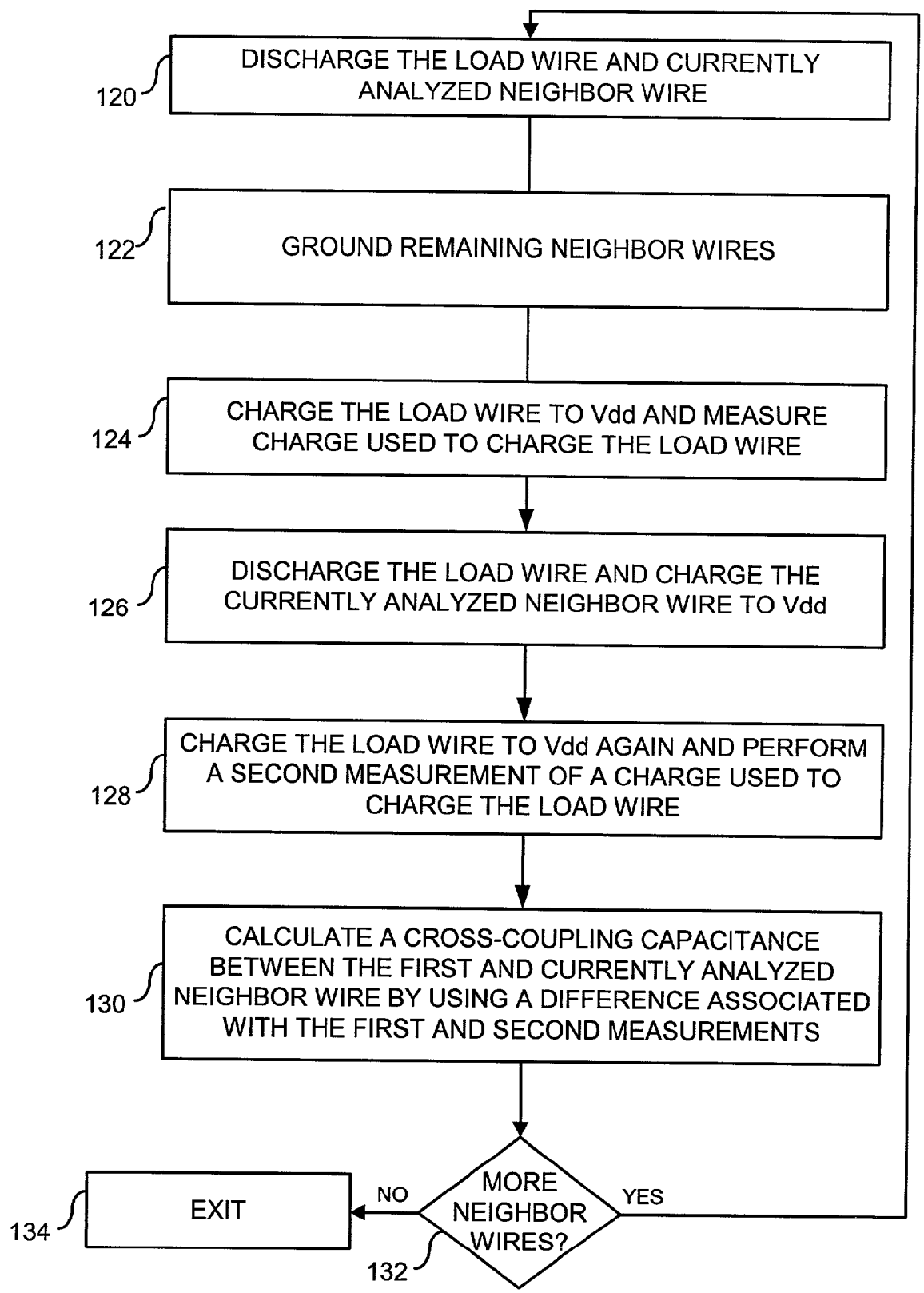
FIG. 9 is a flowchart of a method for measuring cross-coupling capacitance between multiple neighbor wires.

FIG. 9 shows a flowchart of a method for measuring the cross-coupling capacitance on the multiple neighbor wires. The cross-coupling for each neighbor wire is measured one at a time. For the circuit of FIG. 8, assume the cross-coupling capacitance between the load wire 62 and wire 110 is measured first. In process block 120, the load wire 62 and wire 110 are discharged. In process block 122, the neighbor wires 112, 114 not being analyzed yet are discharged. As a result of being discharged, the neighbor wires 112, 114 contribute to the capacitance reading.

In process block 124, the load wire 62 is charged to $V_{dd}$ and the charge is measured using ammeter 52. This measurement includes as a component, the cross-coupling capacitance between load wire 62 and wire 110. In process block 126, the load wire 62 is discharged in preparation for a second measurement of charge. Additionally, the neighbor wire 110 is charged to $V_{dd}$. In process block 128, the load wire 62 is charged again and the charge is measured by ammeter 52. In process block 130, the cross-coupling capacitance between the load wire and wire 110 is calculated by taking a difference between the two measurements using the same technique as already described in relation to FIGS. 5–7. In decision block 132, a check is made whether the cross-coupling capacitance is to be determined for any other neighbor wires. In the example of FIG. 8, the cross-coupling capacitance of neighbor wires 112 and 114 still needs to be measured. Consequently, process blocks 120–130 are repeated with wire 112 being the current wire analyzed while wire 110 is grounded.

The process is then repeated for wire 114. Once all of the neighbor wires are completed, decision block 132 is answered in the negative and the flowchart is exited as indicated at 134.

To determine the total capacitance of a wire (the sum of the cross-coupling capacitance plus the substrate capacitance) in the presence of multiple neighbors the following can be done: The embodiment similar to FIG. 1 can be used to determine the total capacitance, as further described below. By subtracting the total capacitance from the sum of the cross-coupling capacitance, the capacitance to substrate, this quantity has somewhat larger error than the individual cross-coupling capacitance constituents due to transistor mismatch errors.

Figure 10:
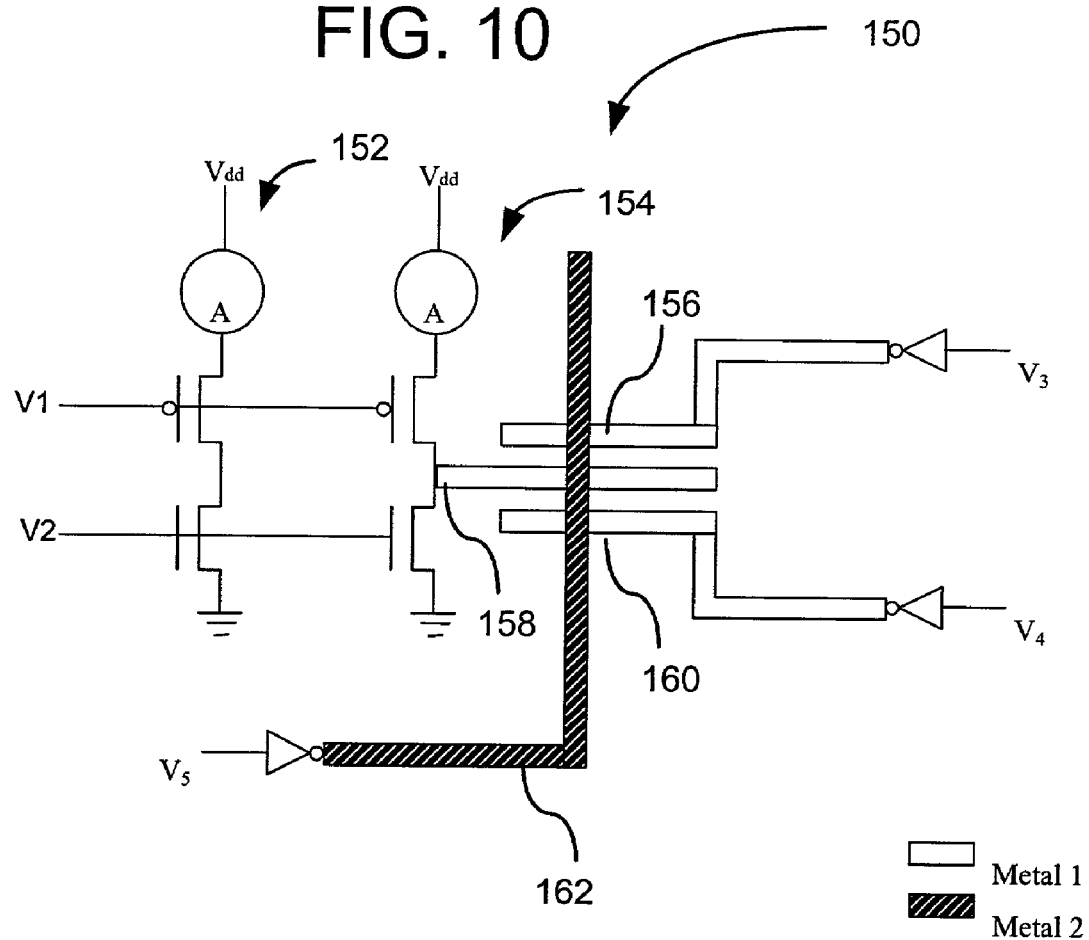
FIG. 10 is another circuit for measuring the cross-coupling capacitance and total capacitance of a multiple wire configuration.

Referring to FIG. 10, a circuit 150 is used for the simultaneous measurement of total capacitance and cross-coupling capacitance of a cell. The circuit has two arms 152, 154. A load wire 158 is on the same metal layer as neighbor wires 156, 160 and on a different metal layer than neighbor wire 162. The following steps may be used for the calculation (some of these steps can be eliminated):

0) Measure the total capacitance of load wire 158 in the presence of its three neighbors.

1) Select one neighbor wire, for example neighbor wire 156, whose cross-coupling capacitance to 158 in the presence of the other wires is to be measured.

2) The reference voltages are set to $V_{dd}$.

3) To obtain setup times, the signals V2 and V1 are oscillating (see FIG. 5 for example waveforms). V3, V4, and V5 are set to $V_{dd}$, thereby grounding their associated wires. Wait for the signals to become stable.

For illustration purposes, assume 10 MHz signals are used for measurement and we have a configuration of n wires, one being the load wire, and we are interested in the total capacitance of the load wire and the larger cross coupling capacitances to its neighbors, typically the closest neighbors:

4) To obtain the total capacitance measurements, start a continuous measurement having the measurement equipment ON for the interval of say 1 second (10^7 periods). The voltage signals V3, V4, and V5 remain at $V_{dd}$, while V2 and V1 are oscillating.

5) During this interval of 1 second (10^7 periods), the DC current on both arms 152, 154 is measured. The measurement is typically done using one ammeter, by measuring the current on arm 152 first for 10^7 periods and then on the other arm 154 for 10^7 periods. This way one avoids systematic errors due to unbalance among different ammeters. These current measurements are stored: I(left arm) and I_0(right arm).

The following formula is then used to calculate total capacitance:

$$Ctotal = \{I\_0(\text{right arm}) - I(\text{left arm})\} * T/V_{dd}$$

This value of Ctotal is stored and is the total capacitance value. If there is negligible leakage current, this value of Ctotal suffices. However, leakage current can also be taken into account provided it is significantly smaller than the measured currents, as further described below.

6) To measure leakage, V2 is oscillating, while V1, V3, V4, and V5 are set to $V_{dd}$. After a setup time, the currents are measured. (This current measurement can be done over a sufficient number of cycles (e.g., 1 second). The leakage current values are called IL (left arm) and IL_0(right arm) and these values are stored for later use.

The leakage currents are applied to the total capacitance value by subtracting these leakage currents from the currents measured under step (5).

$$\text{Total Capacitance} = (I\_0(\text{right arm}) - IL\_0(\text{right arm}) - (I(\text{left arm}) - IL(\text{left arm})) * T/V_{dd}.$$

The correction might become significant for extremely small devices, such as those well below 0.05 microns. If the magnitude of the leakage value becomes comparable to the measured value, then there are problems. However, this is not expected to be the case in the foreseeable future. There are techniques to ensure that this continues to be the case, even when leakage becomes important such as 1<0.05 microns. Thus, it is desirable to use high threshold voltage transistors for the measurements particularly for extremely small devices, also increasing the frequency of operation helps.

7) V2 and V1 are oscillated as before. Then V3 is oscillated to measure the coupling capacitance between the load wire 158 and the wire fed by V3, 156. V4 and V5 are kept at $V_{dd}$.

8) I_1 (right arm) is measured for 1 second (10^7 periods).

The coupling capacitance can be computed using the following formula:

$$C_{coupling} = \{I\_1(\text{right arm}) - I\_0(\text{right arm})\} * T/V_{dd}$$

This value of Ccoupling is stored and represents the coupling capacitance value for the configuration between wire 156 and the load wire 158.

9) If there is leakage V2 and V3 are oscillated while V1, V4 and V5 are set to $V_{dd}$. Another measurement of leakage current is calculated to obtain IL_1(right arm). A corrected formula is used to measure the first cross coupling cap:

$$\text{corrected cross coupling } 1 = (I\_1(\text{right arm}) - I\_0(\text{right arm}) + IL\_0(\text{right arm}) - IL\_1(\text{right arm})) * T/V_{dd}$$

10) Repeat the steps 7 to 10, this time V4 is oscillated while V3 and V5 remain at $V_{dd}$.

11) Repeat the steps 7 to 10, this time V5 is oscillated while V3 and V4 remain at $V_{dd}$.

12) Go to step 1 and repeat for the next device. That is, there may be multiple library elements so proceed with the next library element.

The measurement of $C_{coupling}$ in the circuit of FIG. 4 (represented by an equivalent circuit in FIG. 6) is free of transistor capacitance influence and insensitive to charge redistribution errors, as compared to the dual mirror structured circuits described in the IEEE paper. However, errors arising from coupling to the orthogonal portion of the aggressor wire to the wire under test remain. In one embodiment, for a 0.25 μm process with SiO dielectric, the error bound is 0.02 fF. The magnitude of this error decreases with scaling and lower permitivity dielectric materials. Thus, the measurement described above allows highly accurate measurement of cross coupling capacitance.

The leakage correction is accurate provided that the leakage current is significantly smaller than the conduction currents this being measured. This condition can be tested and assured.

The measurement technique described above is based on static charge measurement.

The technique of the invention provides improved calibration of several capacitance elements with a single structure because the technique is extensible to non-simultaneous switching of multiple neighbors. The timing scheme is similar to the single wire case, with the addition of another voltage signal for each neighbor wire. For example, assume there is one additional neighbor wire to measure and $V_4$: controls the second neighbor wire by an inverter. There are two choices for the timing of $V_4$:

1) $V_3 = V_4$, the simultaneous switching of the two wires (a good practice to use for two neighbor wires that are identical, and separated by the same distance from the middle wire and $2C_{coupling}$ is determined thereby halving the absolute error on $C_{coupling}$); or 2) the central wire to the two neighbor wires (generally different) are determined independently with the same library element, thereby saving valuable space on the silicon chip ($V_4$ has the same sequencing as $V_3$, except that $V_4 = V_{dd}$ while $V_3$ is oscillating). This concept can be extended to additional neighbor wires.

The neighbors can be on different metal layers. For example, a general nearest neighbor configuration can consist of nine wires on three metal layers, where, with one library element one can measure all the couplings from the middle wire in the middle layer to each of its neighbors. There are eight cross couplings and one substrate coupling that can be measured with one library element via a direct extension of the last procedure.

This last technique is particularly useful for library validation. Library validation is the process of building sufficient structures to be measured within the same integrated circuit chip to characterize a design and to validate an extractor tool. Typically, these libraries can be large but kept reasonably small with non-simultaneous switching, as described above. The technique of the invention can also be used to optimize process parameters based on wire timing considerations.

The invention may also be applied in the domain of transmission lines. At high frequencies in the microwave domain where inductance effects are important, the proper representation of wires is in terms of transmission lines (See "Analysis of multiconductor transmission lines," Clayton R. Paul, John Wiley Publisher, 1994). For example, the behavior of current and voltage on wires operating at high frequency is determined by the same equations used in determining transmission line properties. The timing behavior associated with wires corresponds to solutions to the multiconductor transmission line equation. For each signal line, the corresponding multiconductor system is that comprising the signal lines and the surrounding wires that participate as return current paths. These return current paths are nearby parallel lines of power, ground or other signals. The parameters that describe the delay of wires in the system are the following (all quantities are per unit length):

1) The capacitance matrix of this system.
2) The inductance matrix of the system
3) The resistance matrix of the system.

The resistance matrix can be calculated by well-known techniques. The measurement of the capacitance matrix can be accomplished using the techniques described above. It should be noted that the capacitance matrix divided by the dielectric constant for a homogeneous medium is frequency independent, even when the dielectric constant becomes frequency dependent. In fact this ratio corresponds to the capacitance matrix in the vacuum. However, the measurement of the inductance matrix is traditionally very difficult, particularly at high frequencies. (See Bendik Kleveland, Xiaoning Qi, Liam Madden, Robert Dutton and S Simon Wong, "Line inductance extraction and modeling in real Chip with Power Grid," 2000 IEEE International Solid State Circuit Conference ISSCC'00, February 2000).

Consequently, it is desirable to explore new ways to measure the inductance matrix. The invention avoids the problem of measuring inductance at high frequency by using the following fundamental theorem of electrodynamics:

$$L^{-1} = \frac{1}{\varepsilon\mu} C, \qquad \text{Equation (3)}$$

where L the inductance matrix of the configuration, $L^{-1}$ is its inverse, and C the corresponding Capacitance matrix. The parameters $\varepsilon, \mu$ are the dielectric constant of the medium and the magnetic permeability of the medium, which for IC applications coincide with the magnetic permitivity of the vacuum. This theorem holds for homogeneous media (single dielectric, whose dielectric constant does not depend on the orientation), and uniform configurations. This is to say that the environment does not change over the length of the line. Both properties can be met by construction. The uniformity property can be guaranteed in an IC by choosing configurations whose dimensions are sufficiently small to guarantee uniformity. In so far as the requirement of homogeneouness, it can be guaranteed by recreating an analogous environment to the one under consideration with a single homogeneous dielectric. Since the inductance does not depend on the dielectric properties of the material, the resulting value obtained for a configuration that is homogeneous is the same as the one for a heterogeneous configuration.

To paraphrase the algorithm for computing the resulting inductance matrix:

1) What type of medium: Homogeneous, or heterogeneous.

2) If the medium is homogeneous, continue starting with step 3.Otherwise skip steps 3–6.

Figure 11:
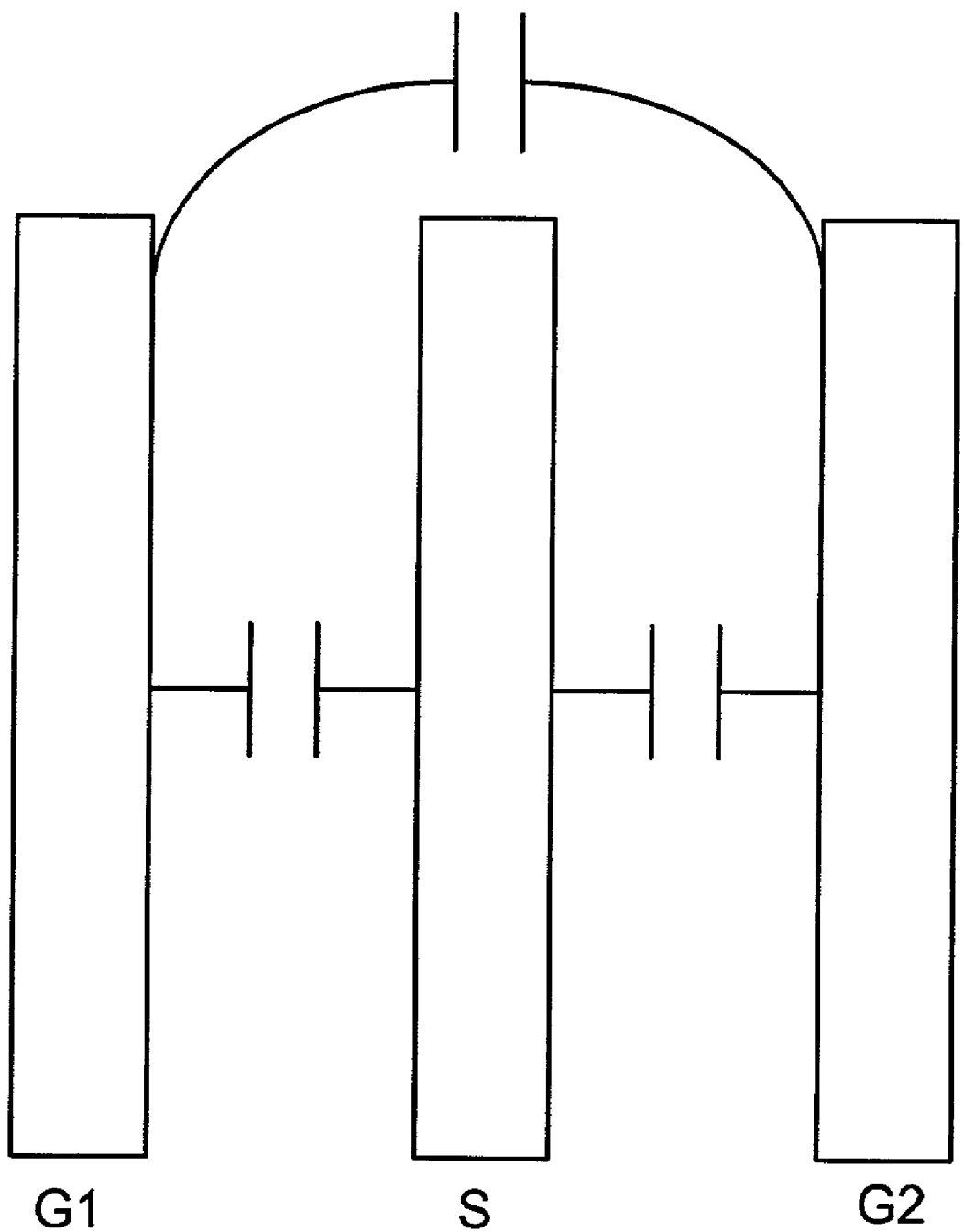
FIG. 11 is an example of the type of configuration whose measurement leads to the determination of high frequency transmission line parameters.

3) Measure the capacitance terms for parallel configurations of wires as displayed on FIG. 11.

4) Use the known low frequency dielectric constant of the medium.

5) Divide each one of the measured capacitance values by the low frequency value of the dielectric constant of the medium, and the magnetic permitivity of the medium.

6) Invert the resulting matrix, using standard methods of numerical analysis.

Figure 12:
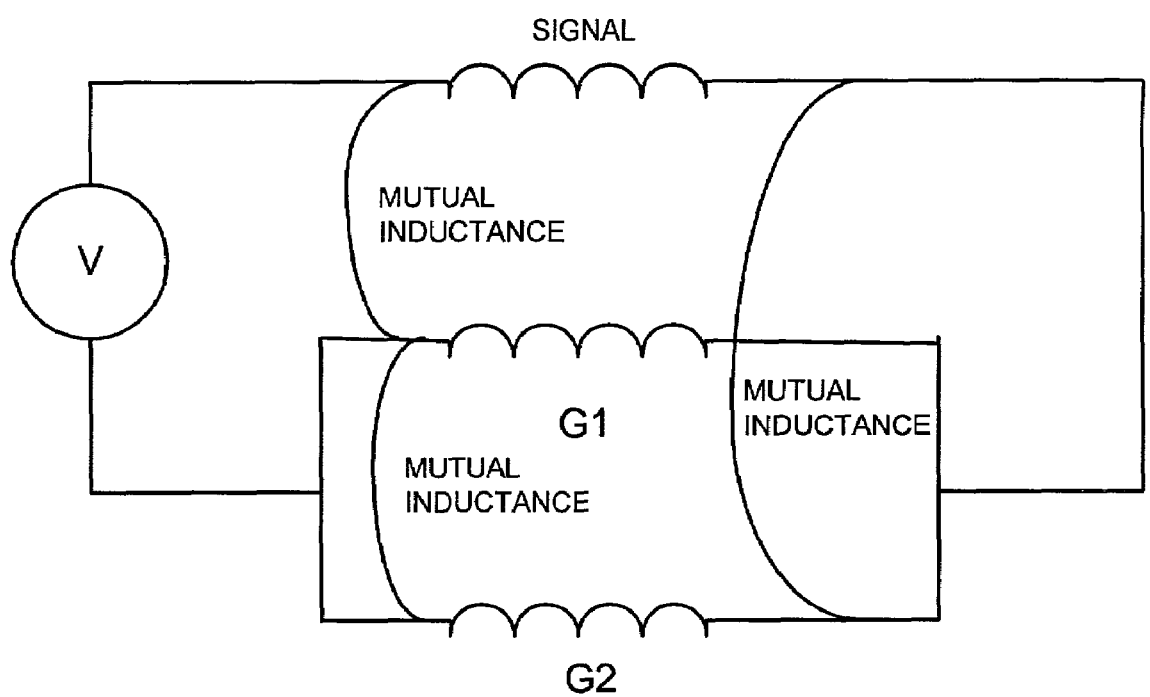
FIG. 12 is the resulting inductance coefficients extracted from the measurements performed on the configuration of FIG. 11.

The resulting high frequency inductance matrix is exemplified in FIG. 12.

7) For more general heterogeneous media do the following:

Replace heterogeneous dielectric medium with homogeneous dielectric medium, such as Silicon Dioxide, and perform the measurements of the capacitance matrix for parallel wire configurations on the homogeneous medium. Do this step only for the purpose of extracting the inductance matrix.

8) Repeat steps 3 to 6 for this homogeneous medium

The resulting inductance matrix for the homogeneous medium will coincide with the corresponding one for the heterogeneous medium. In all previous cases the Inductance matrix refers to the high frequency inductance matrix obtained as a result of low frequency capacitance measurements.

Having illustrated and described the principles of the illustrated embodiments, it will be apparent to those skilled in the art that the embodiments can be modified in arrangement and detail without departing from such principles.

For example, although ammeter 52 is shown between the transistor 56 and $V_{dd}$, in an alternative embodiment, ammeter 52 can be placed between the source of transistor 54 and ground. This alternative embodiment provides the same accuracy and the embodiments described above.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

What is claimed is:

1. A method for measuring cross-coupling capacitance, comprising:
providing at least one first wire coupled to a first charging and discharging circuit structure having a first circuit configuration and at least one second wire that is coupled to a second charging and discharging circuit structure that is not the mirror image of the first charging and discharging circuit structure;
charging the first wire to a predetermined voltage;
performing a first measurement associated with a capacitance of the first wire;
charging the second wire to the predetermined voltage;
recharging the first wire to the predetermined voltage;
performing a second measurement associated with a capacitance of the first wire; and
calculating a difference between the first and second measurements to determine the cross-coupling capacitance between the first and second wires.

2. The method of claim 1, further including coupling a first transistor between a supply voltage and a common node, coupling a second transistor in series with the first transistor between the common node and ground, wherein the first wire is coupled to the common node and wherein the first and second transistors comprise the first charging and discharging circuit structure.

3. The method of claim 2, further including applying a first periodic signal to a gate of the first transistor and a second periodic signal to a gate of the second transistor, to periodically charge and discharge the first wire.

4. The method of claim 3, wherein the first periodic signal and the second periodic signal are timed so that the first and second transistors are not activated simultaneously.

5. The method of claim 1, further including discharging the first wire prior to recharging the first wire.

6. The method of claim 1, further including discharging the second wire prior to charging the first wire.

7. The method of claim 1, further including measuring each of the cross-coupling capacitances for multiple neighbor wires to the first wire.

8. The method of claim 7, wherein measuring the cross-coupling capacitance for the neighbor wires is performed using a same technique as used to measure the cross-coupling capacitance between the first wire and the second wire and using the same transistor configuration.

9. The method of claim 2, further including using the first transistor and second transistor in conjunction with the first wire to measure each cross-coupling capacitance of multiple neighbor wires to the first wire.

10. The method of claim 9, wherein the multiple neighbor wires are in an integrated circuit with multiple metal layers and the neighbor wires can be on any layer and in any orientation relative to each other and to the first wire.

11. The method of claim 1, further including repeating the charging of the first and second wires, repeating the first and second measurements over a number of cycles and calculating an average of the measurements to calculate the difference.

12. The method of claim 1, wherein performing the first and second measurements includes measuring an amount of charge used to charge the first wire to the predetermined voltage.

13. The method of claim 2, further including coupling an ammeter in series with the first and second transistors, and wherein the first and second measurements include measuring a current needed to charge the first wire to the predetermined voltage.

14. The method of claim 1, wherein the first and second wires are unconnected and further including coupling logic to the second wire to charge and discharge the second wire.

15. The method of claim 14, wherein the logic is an inverter.

16. The method of claim 1, wherein the cross-coupling capacitance is calculated between the first and second wires using only a single ammeter.

17. The method of claim 1, wherein the predetermined voltage is a logic high voltage level.

18. The method of claim 1, further including:
a) measuring each of the cross-coupling capacitances for multiple neighbor wires to the first wire;
b) charging the multiple neighbor wires to a high voltage level;
c) measuring a capacitance to ground for the first wire; and
d) adding the capacitance to ground measurement to the cross-coupling capacitance measurements to determine the total capacitance associated with the first wire.

19. A circuit for measuring cross-coupling capacitance, comprising:
first and second transistors coupled in series;
an ammeter coupled in series with the first and second transistors;
a first wire coupled between the first and second transistors;
a second wire unconnected to the first wire, but in fixed relation to the first wire such that a cross-coupling capacitance is created between the first and second wires, the second wire not being coupled between any transistors forming a mirror structure to the first and second transistors; and
wherein the cross-coupling capacitance is measured between the first and second wires by subtracting two capacitance-related measurements associated with the first wire, one of the measurements being performed with the second wire at a first voltage level and the other of the measurements being performed with the second wire charged to a second voltage level.

20. The circuit of claim 19, wherein the first voltage level is ground and the second voltage level is a logic high.

21. The circuit of claim 19, further including logic coupled to the second wire for charging and discharging the second wire.

22. The circuit of claim 21, wherein the logic includes an inverter.

23. The circuit of claim 19, wherein the first and second transistors each have source-to-drain paths, wherein the source-to-drain paths of each transistor are coupled in series between power and ground, with gates of the first and second transistors coupled to different periodic signals for controlling the charging and discharging of the first wire.

24. The circuit of claim 23, wherein the periodic signals are timed such that the first and second transistors are not activated simultaneously.

25. The circuit of claim 19, wherein the first and second wires can be in any configuration to each other including being in parallel to each other.

26. The circuit of claim 19, wherein only one ammeter is used in the measurement of the cross-coupling capacitance.

27. The circuit of claim 19, further including measuring the cross-coupling capacitance for multiple neighbor wires to the first wire.

28. The circuit of claim 27, wherein measuring the cross-coupling capacitance for the neighbor wires is performed using a same technique as used to measure the cross-coupling capacitance between the first wire and the second wire and using the same transistor configuration.

29. The circuit of claim 27, wherein the multiple neighbor wires are in an integrated circuit with multiple metal layers and the neighbor wires can be on any of the metal layers and in any orientation relative to each other and relative to the first wire.

30. The circuit of claim 19, further including using the first transistor and second transistor in conjunction with the first wire to measure each cross-coupling capacitance of multiple neighbor wires to the first wire and wherein the measurements of each cross-coupling capacitance is accomplished with one library element.

31. A circuit for calculating a cross-coupling capacitance, comprising:
means for charging and discharging a first wire, wherein the means for charging and discharging the first wire includes serially coupled transistor means, wherein the first wire is coupled between the serially coupled transistors;
a single ammeter means for measuring charge on the first wire in order to calculate capacitance associated with the first wire;
logic means for charging and discharging a second wire; and
means for calculating a cross-coupling capacitance by measuring charge needed to charge the first wire to a predetermined voltage with the second wire grounded and measuring charge needed to charge the first wire to the predetermined voltage with the second wire charged to the predetermined voltage and taking a difference between the two measurements.

* * * * *

UNITED STATES PATENT AND TRADEMARK OFFICE
CERTIFICATE OF CORRECTION

PATENT NO. : 7,099,808 B2
APPLICATION NO. : 09/957889
DATED : August 29, 2006
INVENTOR(S) : Suaya et al.

It is certified that error appears in the above-identified patent and that said Letters Patent is hereby corrected as shown below:

Column 3, line 63, "capacitance" should read -- capacitance. --

Column 6, line 19, $(C_1+C_2+C_{coupling})$" should read -- $(C_1+C_2+C_{coupling})$ --

Column 6, line 39, "$Vdd$" should read -- $V_{dd}$ --

Column 6, line 43, "$V_3$ 0" should read -- $V_3 = 0$ --

Column 9, line 46, "$V_4$: controls" should read -- $V_4$ controls --

Signed and Sealed this

Thirty-first Day of July, 2007

JON W. DUDAS
*Director of the United States Patent and Trademark Office*